United States Patent
Molnar et al.

(10) Patent No.: US 6,483,380 B1
(45) Date of Patent: Nov. 19, 2002

(54) $G_MC$ FILTER AND METHOD FOR SUPPRESSING UNWANTED SIGNALS INTRODUCED BY THE FILTER

(75) Inventors: Alyosha C. Molnar, Costa Mesa, CA (US); Rahul Magoon, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/663,848

(22) Filed: Sep. 18, 2000

(51) Int. Cl.[7] .................................................. H00K 5/02
(52) U.S. Cl. ......................................... 327/552; 327/103
(58) Field of Search ................................ 327/103, 552, 327/553, 554, 555, 556, 557, 558, 559; 330/305

(56) References Cited

U.S. PATENT DOCUMENTS

| | | | |
|---|---|---|---|
| 6,031,416 A | | 2/2000 | Baschirotto et al. ........ 327/552 |
| 6,069,522 A | * | 5/2000 | Venkatraman et al. ...... 327/552 |

* cited by examiner

*Primary Examiner*—Dinh T. Le
(74) *Attorney, Agent, or Firm*—Welsh & Katz, Ltd.

(57) ABSTRACT

A $G_mC$ filter that suppresses unwanted signals generated by a $G_mC$ compression stage. The $G_mC$ filter utilizes the same compression stage for the decompression stages. By using the same compression stage for the decompression stages unwanted in-band signals generated by the compression stage are suppressed. Further, over all circuitry is decreased, power is saved, and $G_mC$ filter design is simplified.

26 Claims, 7 Drawing Sheets

$G_MC$ FILTER AND METHOD FOR SUPPRESSING UNWANTED SIGNALS INTRODUCED BY THE FILTER

BACKGROUND OF THE INVENTION

1. Field of the Invention.

This invention relates generally to a differential analog circuit and, more particularly, to a high speed $G_mC$ integrated filter.

2. Related Art.

Transconductor-capacitor ($G_mC$) filters are typically continuous wave filters used in communications systems. A transconductor is an element that delivers an output current $i_c$ that is proportional to the input signal voltage $V_{in}$. For a bipolar device, the following relationship exists:

$$i_c = g_m * V_{in}$$

where $g_m$ is the transconductance of the element. In general, the larger the transconductance, the greater the gain.

When a capacitor is connected to the output of a transconductor, an integrator is formed. Monolithic filters may thus be implemented using $G_mC$ integrators. Transconductance is defined as the ratio of the change in collector current ($I_C$) to the change in input voltage. If $dI_C$ represents a change in collector or drain current caused by a small change in input voltage ($V_{in}$), then the transconductance is:

$$g_m = \frac{dI_c}{dV_{in}}$$

Figure 1:
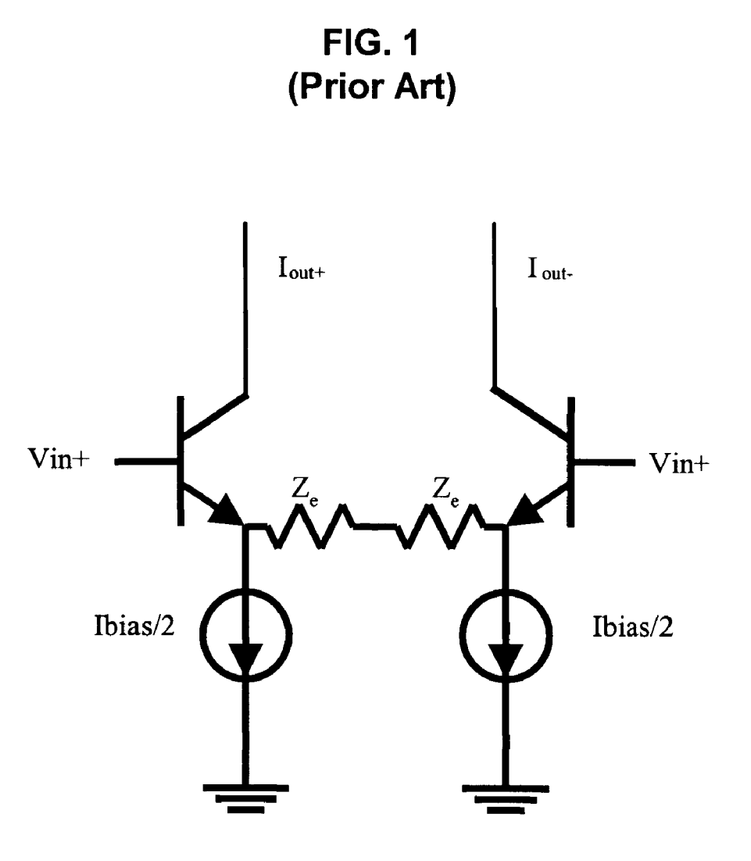
FIG. 1 is a circuit diagram illustrating a prior art differential pair transistor circuit whose transconductance is defined by its degeneration resistors.

As is known in the prior art, FIG. 1 is a diagram that illustrates a differential-pair transconductance stage as commonly used in many RF building blocks, such as low-noise amplifiers and mixers. To improve linearity, an impedance $Z_e$ may be implemented using resistors, capacitors, or inductors usually connects transistors of the transconductance stages.

In typical communication systems, the $G_mC$ filter may be an important building block of a receiver. However, $G_mC$ filters introduce noise that must be considered in the design of the filter architecture. To compensate for the added noise introduced by $G_mC$ filter, circuit designers include circuitry to compensate for the noise characteristic, and/or utilize large bias currents to reduce the impact of noise. Adding circuitry to compensate for the introduced noise results in increased die size and, hence, increases design and manufacture costs.

Providing large current sources to compensate for noise added by the $G_mC$ filter has the side effect of shortening the life of the devices that utilize the filter. For example, a battery of a cellular phone may last longer if a large current source was not necessary to suppress the noise introduced by the filter.

While the existing approaches to $G_mC$ filter design are relatively satisfactory, solutions used to compensate for noise added by the filter have undesirable effects. Further, using large current sources to improve the noise characteristic results in shortened battery life of products that utilize $G_mC$ filters. Accordingly, a need exists for a circuit for improving the performance of $G_mC$ filters.

SUMMARY

This invention provides a circuit for suppressing unwanted signals introduced by a $G_mC$ filter compression stage. The compression stage is implemented by coupling the output of the compression stage to the input of a first decompression stage, which is termed a feedback portion. The output of the first decompression stage is coupled to the input of the compression stage. The output of the compression stage is coupled to the input of a second decompression stage, which is termed a feedforward portion. This circuit utilizes the same compression stage for both the feed back and feed forward portions of the $G_mC$ filter. By utilizing the same compression stage for the feed back and the feed forward, unwanted noise and dc offsets introduced by the compression stage of the $G_mC$ filter are suppressed.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 2:
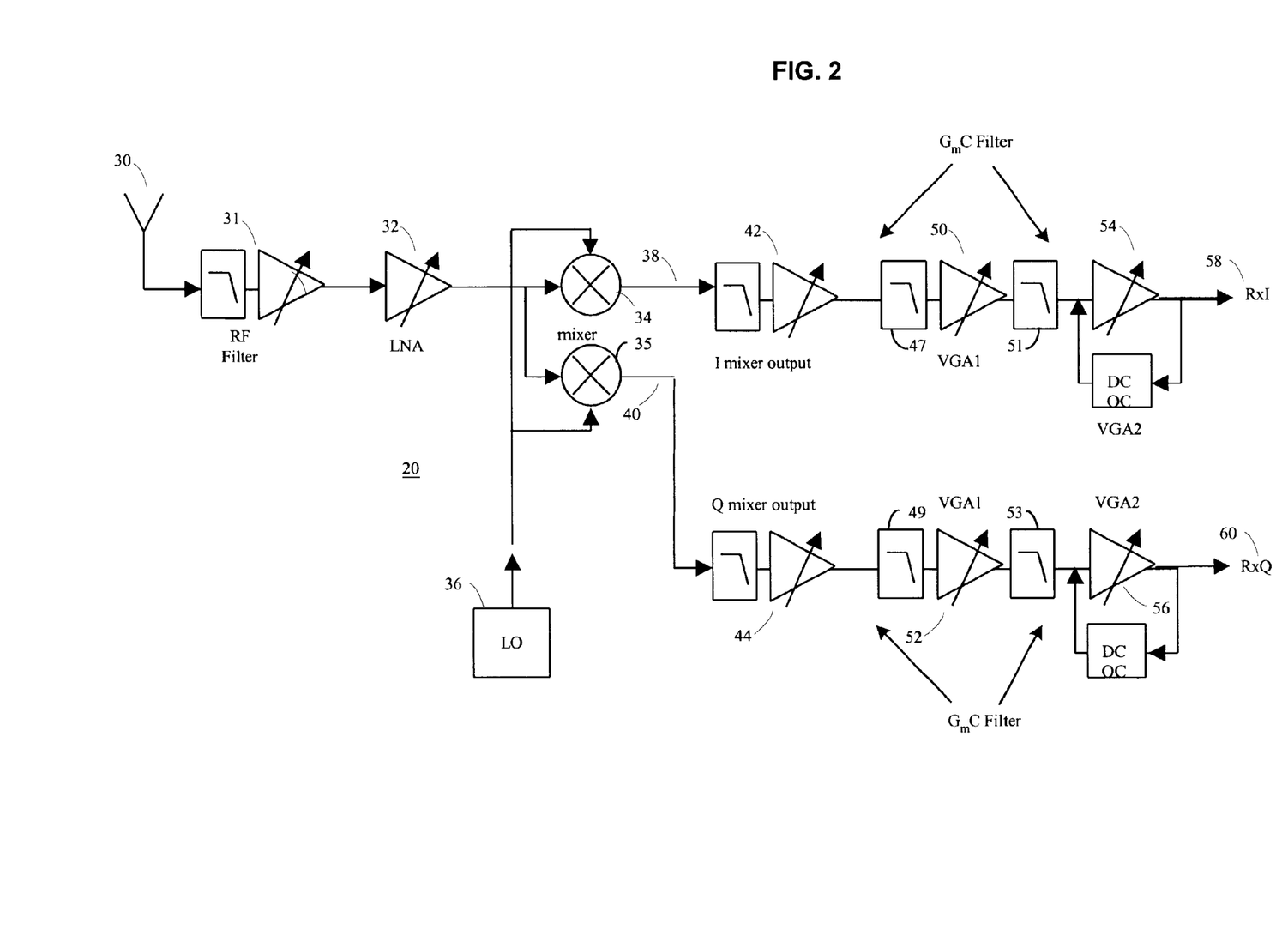
FIG. 2 is a circuit diagram illustrating a simplified receiver.

FIG. 2 is a circuit diagram showing an embodiment of a receiver system 200 that functions to isolate a received signal 202. A discrete component RF front-end filter 204 serves to remove out-of-band energy and rejects image-band signals. After an initial amplification of the received signals by a low noise amplifier (LNA) 206, the entire signal spectrum, including both wanted and unwanted signal energy, is frequency translated to a fixed intermediate frequency (IF) by mixers 208 and 210 utilizing a local oscillator (LO) 212 that is tuned to a desired carrier frequency.

At the outputs 214 and 216 of the mixers 208 and 210, a selected received channel has been translated to the same predetermined IF frequency. Because the desired carrier at IF is typically frequency translated to the same intermediate frequency, baseband filters 218 and 220 may now be used to remove signal energy in alternate I and Q channels. After baseband filters 218 and 220, the desired signal is amplified using a variable gain amplifier (VGA) (222, 224, 226 and 228) to adjust the amplitude of the desired signal. Filters (230, 232, 234 and 236) implemented using the novel $G_mC$ architecture further process the desired signal. At the output of the receiver system 200 is the processed received signal 202 in alternate $R_xI$ 58 and $R_xQ$ 60 channels.

In some systems, such as a heterodyne receiver, a second mixer (not shown) that shifts the desired signal to a low or zero IF may follow a particular set of IF filters. After the desired carrier is frequency translated, baseband filters (218 and 220) may be used to remove signal energy in alternate I and Q channels. Whether the receiver is direct conversion, as in the exemplary embodiment, or is of the heterodyne type, it is desirable to filter adjacent I and Q channels using tunable base-band filters, such as $G_mC$ filters. For a more detailed discussion of radio frequency receivers, reference may be made to readily available RF system design books as are well known in the art.

Figure 3:
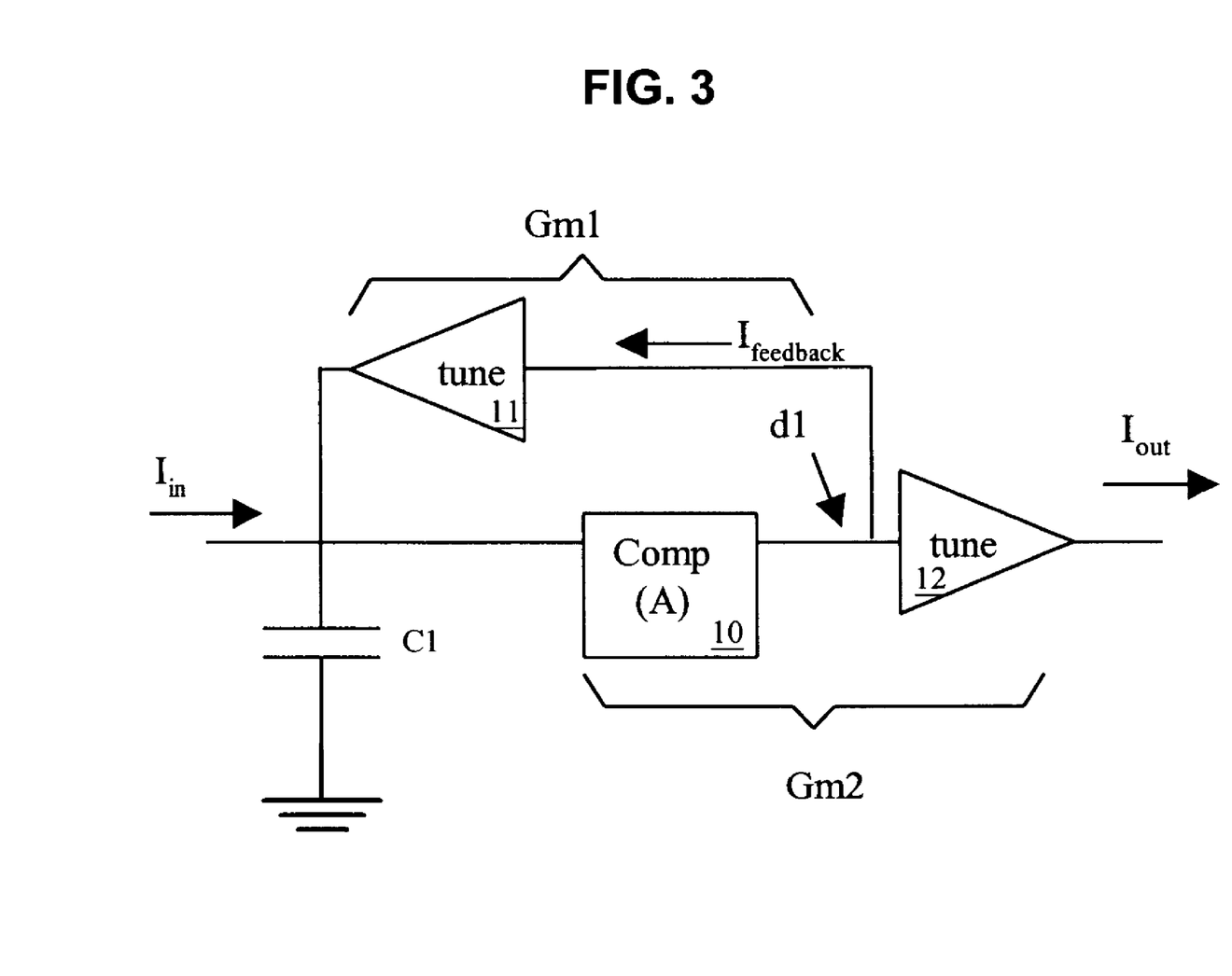
FIG. 3 is a circuit diagram illustrating a simplified architecture of a $G_mC$ filter of the receiver of FIG. 2.
Figure 5:
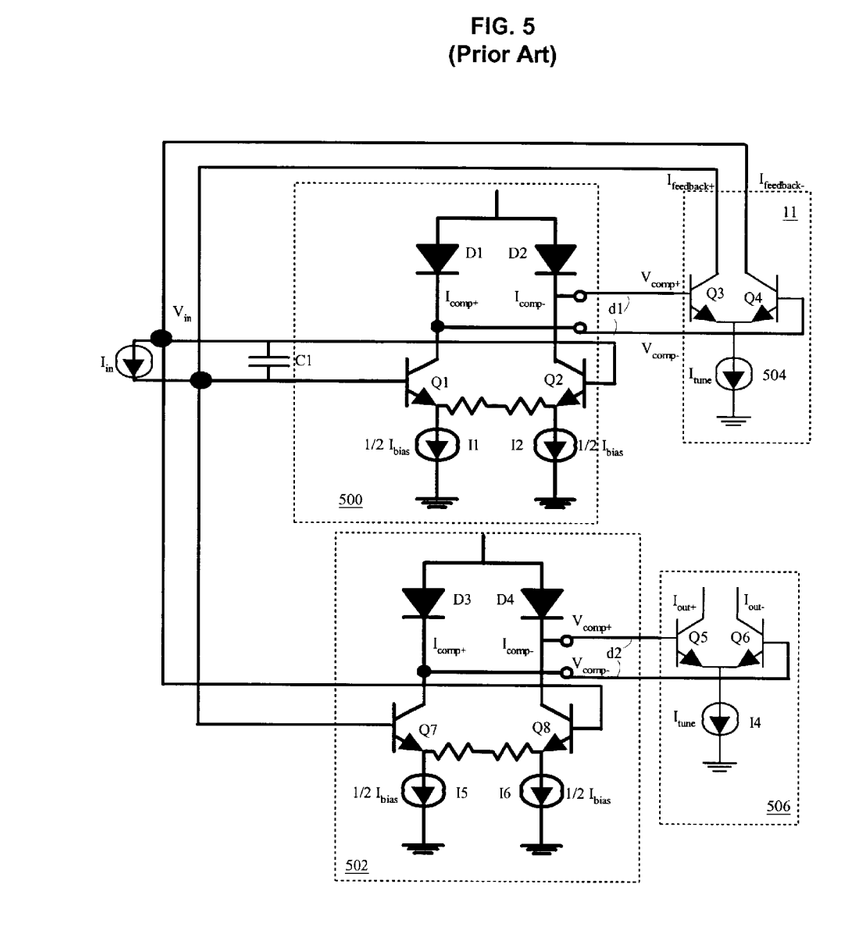
FIG. 5 is a circuit diagram illustrating a simplified architecture of a prior art $G_mC$ filter.

FIG. 3 illustrates a system diagram of a $G_mC$ filter 300 of an exemplary embodiment of the invention. The $G_mC$ filter 300 shown in FIG. 3 receives a current mode input signal $I_{in}$ and includes a capacitor C1, a differential emitter transistor circuit (also referred to in later sections as a compression stage) 302, a first emitter coupled transistor circuit 304, and a second emitter coupled transistor circuit 306. The first and second emitter coupled transistor circuits 304, 306 may also be referred to as decompression stages. In this embodiment, there is a single compression stage 302 that drives two decompression stages 304 and 306. Alternatively, a single compression stage may drive more than two decompression stages. One advantage of using the same compression stage to drive more than one decompression stage is that circuitry is reduced. By reducing circuitry, the current consumed by the $G_mC$ filter 300 is decreased over prior art filter architectures, such as shown in FIG. 5.

Figure 4:
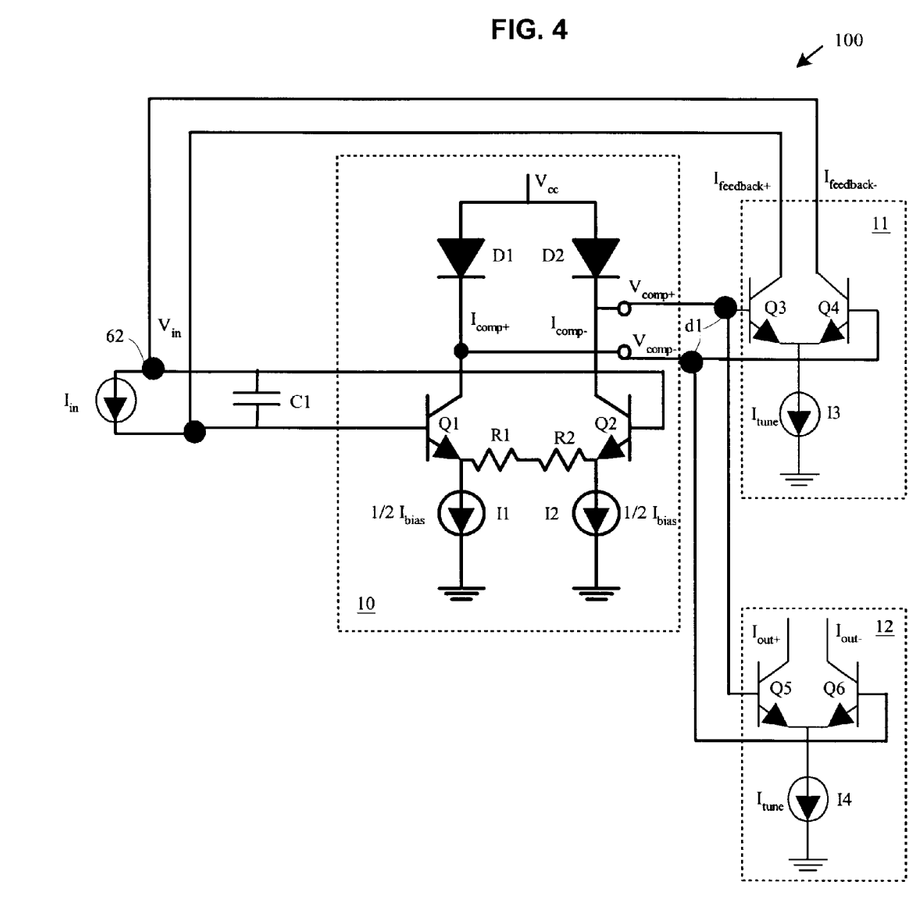
FIG. 4 is a circuit diagram illustrating a simplified system diagram of the $G_mC$ filter of FIG. 3.

FIG. 4 is an illustrative circuit diagram of the $G_mC$ filter 300 of FIG. 3. The differential emitter transistor circuit 400 may have transistors Q1 and Q2, emitter degeneration resistors R1 and R2, constant current sinks I1 and I2 and diodes D1 and D2. Emitters of the transistors Q1 and Q2 are each connected to the current sinks I1 and I2, respectively. Collector electrodes of the transistors Q1 and Q2 are each connected to diodes D1 and D2, respectively. $I_{bias}$ represents a total current passing through current sinks I1 and I2. The emitter degeneration resistors R1 and R2 are connected between the emitter electrodes of the transistors Q1 and Q2. $R_e$ represents the resistance of the emitter degeneration resistors R1 and R2.

Although circuit 400 is illustrated with resistors R1 and R2, circuit 400 may also include other impedance inducing devices, such as inductors and capacitors. Substituting various impedance inducing devices into circuit 400 may provide a number of equivalent circuits. However, substituting various impedances for the resistors may be understood to change the frequency response of the circuit 400.

The first emitter coupled transistor circuit 402 may have transistors Q3 and Q4 and a constant current sink I3. Emitters of the transistors Q3 and Q4 are each connected to constant current sink I3. The second emitter coupled transistor circuit 404 may have the emitters of the transistors Q5 and Q6 connected to a constant current sink I4, as shown. Emitters of the transistors Q5 and Q6 are each connected to the current sink I4. As used in the equations below, $I_{tune}$ represents a current passing through current sink I3 which is also the current passing through current sink I4.

The current-mode input $I_{in}$ is converted to voltage $V_{in}$ by the impedance of the capacitor C1. The voltage $V_{in}$ supplies an input voltage between base electrodes of the transistors Q1 and Q2 of the transistor circuit 400, as shown. The transistors Q1 and Q2 with emitter degeneration resistors R1 and R2 (together often referred to as a degenerated differential pair) convert the voltage $V_{in}$ to a current. The diodes D1 and D2 convert the current to a compressed voltage, $V_{comp}$ (shown in FIG. 4 as the potential between $V_{comp+}$ and $V_{comp-}$). Since circuit 400 produces a compressed voltage, $V_{comp}$, it is termed a compression stage.

The compressed voltage, $V_{comp}$, supplies a voltage between base electrodes of the transistors Q3 and Q4. Emitters of the transistors Q3 and Q4 are each connected to the current sink I3. The collector electrodes of the transistors Q3 and Q4 provide a decompressed feedback current $I_{feedback}$ (shown in FIG. 3 as $I_{feedback+}$ and $I_{feedback-}$). Since circuit 402 produces a decompressed current, $I_{feedback}$, it is termed a decompression stage.

Following the decompression stage of circuit 402, current $I_{feedback}$ is fed back through the compression stage of circuit 400 to produce an effect upon the compressed voltage $V_{comp}$. The compressed voltage $V_{comp}$ also supplies a voltage between base electrodes of transistors Q5 and Q6. The collector electrodes of the transistors Q5 and Q6 provide a decompressed current $I_{out}$. Since circuit 404 produces a decompressed current, $I_{out}$, it is also termed a decompression stage.

The loop formed by feeding current $I_{feedback}$ back into the input of the compression stage cancels low-frequency noise and DC offsets introduced by other components of the circuit 400 including Q1, Q2, R1, R2, D1, D2, and especially bias sources I1 and I2. The output current is roughly equal to the input current when the filter 300 operates at low frequencies (i.e. below corner of filter). $I_{in}$ is the input current which through the feedback action of the filter is roughly equal to $I_{out}$ for in-band signals.

The combination of the compression stage 400 with decompression stages 402 and 404 provides a highly linear transconductance filter 300 that is substantially limited by the linearity of the compression stage 400. The value of the transconductance is given by a ratio of $I_{bias}$ to $I_{tune}$ and the degeneration resistance $R_e$. The filter 300 is current tunable by varying $I_{tune}$ relative to $I_{bias}$.

The filter 300 may be tuned by the appropriate selection of current sinks I3, I4. The combination of the compression stage 400 with decompression stages 402 and 404 is commonly referred to as a two-quadrant Gilbert multiplier. Such multipliers generate the linear product of two input signals. For example, $I_{feedback}$ is the product of the differential output current from Q1 and Q2 by the ratio of $I_{bias}$ to $I_{tune}$.

The operation of the exemplary filter 300 can be described in greater detail with reference to Equation (1) below which relates the differential current $I_{comp}$ of the collectors of transistors Q1 and Q2 to circuit parameters $V_{in}$, $R_e$ and $g_m$.

$$I_{comp} = \frac{V_{in}}{R_e + 1/g_m} \qquad \text{Equation 1}$$

If $R_e$ is much greater than $1/g_m$, then equation (1) simplifies to equation (2).

$$I_{comp} = \frac{V_{in}}{R_e} \qquad \text{Equation 2}$$

As is known in the art, $R_e$ is usually greater than $1/g_m$. The differential current $I_{comp}$ may be expressed as a function of the voltage across the bases of transistors Q1 and Q2 over the resistance between the emitters of the transistors Q1 and Q2.

Equation (3) below expresses differential voltage $V_{comp}$ of collector potentials $V_{comp+}$ and $V_{comp-}$ of the transistors Q1 and Q2 as the difference in voltage across the diodes D1 and D2. Thus, the potential across the diodes is the difference between $V_{comp}$ and $V_{cc}$.

$$V_{comp} = V_{comp+} - V_{comp-} \text{ where}$$

$$V_{comp+} = V_t * \ln\left(\frac{I_{comp+}}{I_{comp}}\right) - V_{cc}$$

$$V_{comp-} = V_t * \ln\left(\frac{I_{comp-}}{I_{comp}}\right) - V_{cc}$$

Equation 3

Simplification yields the following relationship.

$$V_{comp} = V_t * \left(\ln\left(\frac{I_{comp+}}{I_{comp}}\right) - \ln\left(\frac{I_{comp+}}{I_{comp}}\right)\right)$$

$$= V_t * \ln\left(\frac{\frac{I_{comp+}}{I_{comp}}}{\frac{I_{comp-}}{I_{comp}}}\right)$$

$$= V_t * \ln\left(\frac{I_{comp+}}{I_{comp-}}\right)$$

$$= 2 * V_t \tanh^{-1}\left(\frac{I_{comp}}{I_{comp+} + I_{comp-}}\right)$$

Equation 4

Substituting equation (2) into equation (4) and noting that the sum of $I_{comp+}$ and $I_{comp-}$ is $I_{bias}$ yields equation (5).

$$V_{comp} = 2 * V_t * \tanh^{-1}\left(\frac{V_{in}}{R_e * I_{bias}}\right)$$

Equation 5

The voltage at the collectors of the compression stage is expressed as a hyperbolic tangent function of the ratio of the input voltage to degeneration voltage (i.e. $R_e * I_{bias}$) multiplied by the thermal voltage of the transistors Q1 and Q2, namely $V_t$.

Taking equation (4) and applying it to the second emitter coupled transistor circuit 404 (so that $I_{comp}$ is replaced with $I_{feedback}$ and $I_{comp+}$ and $I_{comp-}$ is replaced with $I_{tune}$) and inverting to solve for $I_{feedback}$ yields equation (6).

$$I_{feedback} = I_{tune} * \tanh\left(\frac{V_{comp}}{2 * V_t}\right)$$

Equation 6

Substituting equation (5) into equation (6) yields equation (7).

$$I_{feedback} = I_{tune} * \tanh\left(\frac{V_t * 2 * \tanh^{-1}(V_{in}/Re * I_{bias})}{2 * V_t}\right)$$

$$= I_{tune} * \tanh\left(\tanh^{-1}\left(\frac{V_{in}}{R_e * I_{bias}}\right)\right)$$

$$= I_{tune} * \frac{V_{in}}{R_e * I_{bias}}$$

$$= V_{in} * \frac{I_{tune}}{R_e * I_{bias}}$$

Equation 7

As may be discerned from equations (4–7), signal processing within the differential emitter transistor circuit 400 and first and second emitter coupled transistor circuits 402 and 404 are related by tanh and $\tanh^{-1}$ functions. Signal processing within the differential emitter transistor circuit 400 using the $\tanh^{-1}$ function results in an effective compression of the signal using a first set of coefficients. Processing of the compressed signal subsequently occurs within the first and second emitter coupled transistor circuits 402 and 404. The first and second emitter coupled transistor circuits 402 and 404 effectively decompress the signal using the tanh function and a second set of coefficients.

In effect compression within a first compression stage 400 occurs with a predetermined bias current, namely I1 and I2, which determines the first set of compression coefficients. When the compressed signal is decompressed in decompression stages 402 and 404, it is decompressed with some other amount of bias current, namely I3 and I4 resulting in the second set of coefficients. The result is a gain that is controlled by those two bias currents, linearly. In other words, the result is a gain that is controlled by the bias currents, I1, I2, I3, and I4. Assuming that I1 and I2 are related to $I_{bias}$ and I3 and I4 are equal to $I_{tune}$, then the gain is controlled by the two bias currents, $I_{bias}$ and $I_{tune}$.

Compression and decompression (and reference to compression and decompression stages) inherently refers to the effect of the tanh and $\tanh^{-1}$ functions and the relationship of coefficients caused by the related set of bias currents. In effect the bias currents may be used to tune the gains of the compression and decompression stages while still achieving a high degree of linearity.

The filter 300 may be analyzed through an assumption of linearity, because while the compression stage 400 and decompression stages 402 and 404 are each highly nonlinear in isolation, when used in conjunction (i.e., with a compression stage 400 providing the input to decompression stages 402 and 404) the overall behavior is highly linear. The compression stage 400 may be described as a voltage amplifier with the gain described by the term comp in the following relationship.

$$comp = \frac{V_t}{R_e * I_{bias}}$$

Equation 8

The decompression stages 402, 404 may be linearized with the transconductance for circuit 402 described by the term tune1 and the transconductance for circuit 404 described by the term tune2 as follows.

$$tune1 = \frac{I_{tune}}{V_t}$$

Equation 9

$$tune2 = \frac{I_{tune}}{V_t}$$

Equation 10

FIG. 3 illustrates a system diagram of one embodiment of the $G_mC$ filter 300 with unwanted noise and interference shown introduced as signal d1. Standard control theory may be used to show that for a system with negative feedback, as shown in FIG. 3, the forward transfer function may be defined by equation (11).

$$\frac{I_{out}}{I_{in}} = \frac{Z_c * comp * tune2}{1 + Z_c * comp * tune1},$$

Equation 11 where comp*tune1=$G_m1$, comp*tune2=$G_m2$ and $Z_c=1/s*C$.

The combined transconductance of the differential emitter transistor circuit 400 and first emitter coupled transistor circuit 402 is $G_m1$ and the combined transconductance of the differential emitter transistor circuit 400 and second emitter coupled transistor circuit 404 is $G_m2$. The relation of $G_m1$ and $G_m2$ may be as shown below. Transconductances $G_m1$ and $G_m2$ of the first and second stages may each be expressed by equations (12 and 13), respectively.

$$G_m1 = \frac{I_{feedback}}{V_{in}} = \frac{I_{tune}1}{R_e * I_{bias}} \qquad \text{Equation 12}$$

$$G_m2 = \frac{I_{feedback}}{V_{in}} = \frac{I_{tune}1}{R_e * I_{bias}} \qquad \text{Equation 13}$$

Making the substitutions for $G_m1$ and $G_m2$, equation (11) simplifies to equation (14).

$$\frac{I_{out}}{I_{in}} = \frac{G_m2}{s * C + G_m1} \qquad \text{Equation 14}$$

Figure 6:
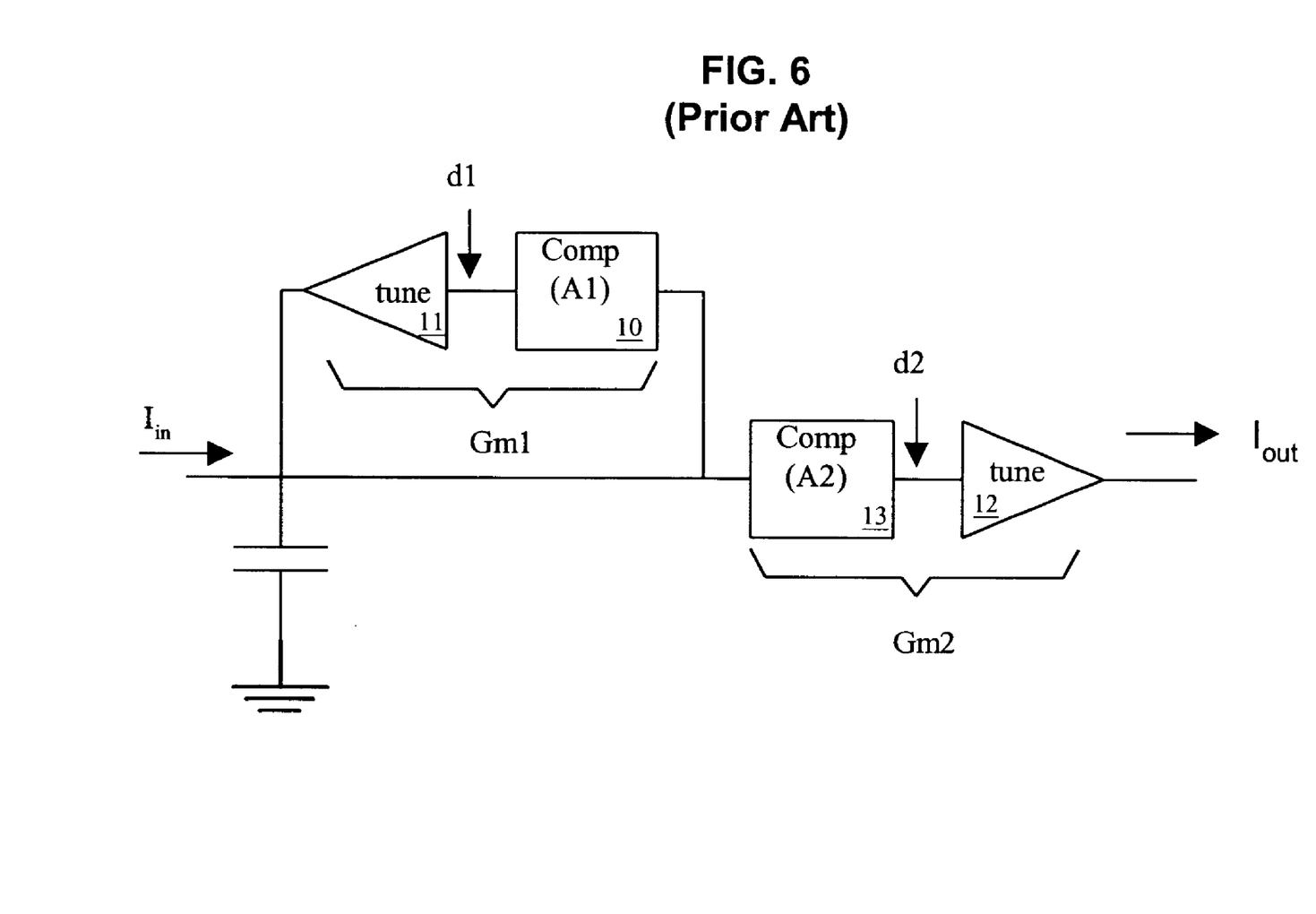
FIG. 6 is a circuit diagram illustrating a simplified system diagram of the $G_mC$ filter of FIG. 5.

Consider a single pole $G_mC$ filter with current mode input and output having the transfer function of equation (14). Such a filter could be implemented as a prior art filter having two compression stages 500 and 502 (as shown in FIG. 5), or with a single compression stage 400 of the $G_mC$ filter of the present invention (as shown in FIG. 4). FIG. 6 illustrates a system diagram of a prior art filter having two compression stages 600 and 602. The combined transconductance of the compression stage 600 and decompression stage 604 is $G_m1$ and the combined transconductance of the compression stage 602 and decompression stage 606 is $G_m2$. A perturbation may be introduced within each compression stage. For the example of FIG. 6 perturbations d1 and d2 are introduced as shown. For the prior art filter, the output current due to such perturbations may provide a response as described by equation (15).

$$\frac{G_m2}{A}\left[d2 + d1\left(\frac{G_m1}{G_m1 + sC}\right)\right] \qquad \text{Equation 15}$$

DC offsets may be present in the output signal. Also, inband perturbations may also form a portion of the output signal, where inband is defined as frequencies less than $G_m1/(C*2\pi)$.

Where only a single compression stage 400 is used (as in the $G_mC$ filter 300), only a single perturbation d1 is present. The output due to perturbation d1 may be described by equation (16).

$$\frac{G_m2}{A}\left(d1\frac{sC}{G_m1 + sC}\right). \qquad \text{Equation 16}$$

Note that this transfer function has a zero at DC and a pole at the bandwidth of the filter, demonstrating that inband perturbations have been suppressed, and DC offsets completely cancelled. It may be seen that noise, DC offsets and interference appearing in the compression circuitry may be significantly reduced, leaving only the perturbations introduced by the tuning stages.

With cancellation of unwanted components of the circuit 300 illustrated by equation (16), the relation between transconductances $G_m1$ and $G_m2$ of the first and second stage circuits 402 and 404 may be illustrated by equation (17).

$$G_m2/G_m1 = \frac{I_{out}/(R_e * I_{bias})}{I_{feedback}/(R_e * I_{bias})} = \frac{I_{out}}{I_{feedback}} \qquad \text{Equation 17}$$

Alternatively, $$I_{out} = I_{feedback} * \frac{G_m2}{G_m1} \qquad \text{Equation 18}$$

In other words, unwanted noise and dc-offsets may be strongly suppressed in the $G_mC$ filter 300 of the illustrated embodiment relative to desired in-band signals.

To summarize, the $G_mC$ filter 300 of FIG. 4 provides a number of benefits. First, a reduction in the number of compression stages reduces the number of devices and especially the number of resistors and matched current sources, which tend to consume significant die area. The filter 300 also has the potential of significantly reducing current consumption within signal processing devices. Each compression stage consumes current. Thus, a reduction in the number of compression stages may educe the total amount of current consumed.

In one embodiment, the filter 300 reduces dc offset. By including compression stages that drive feedforward transconductances in feedback loops, the dc offsets causes by component mismatch in compression stages may be reduced and, in theory, completely cancelled out. This is important for two reasons. One reason is that a reduction in dc offset simply results in better performance. The other reason is that by easing the mismatch criteria for the compression stages, one reduces the amount of area consumed by resistors, current sources, etc.

Other advantages accrue due to. reduced noise. For example, the filter 300 suppresses in-band noise generated in compression stages that drive feedback $G_mCs$. The advantage of suppressing in-band noise is especially important when the filter 300 requires transistors and metal oxide semiconductor (MOS) current sources are used. Such devices generate flicker noise that is highest at signal frequencies close to dc and decreases in proportion to the inverse of frequency. Thus, at frequencies close to dc, which is normal for a GmC filter used in RF applications, flicker noise is especially well suppressed by an embodiment of this filter 300.

Filter 300 can reduce sensitivity to coupling. The same mechanisms that reduce dc offset and noise also function to reduce coupling sensitivity.

Although the embodiment illustrated in FIGS. 2–4 has been described with reference to a single-pole filter with feedback that includes only one capacitor, higher order filters and filters utilizing loops that contain two or more capacitors are also possible. Higher order filters allow for implementation of complex poles as is required in many classes of filters including Butterworth, Bessel, and order two and higher Chebychev filters.

Figure 7:
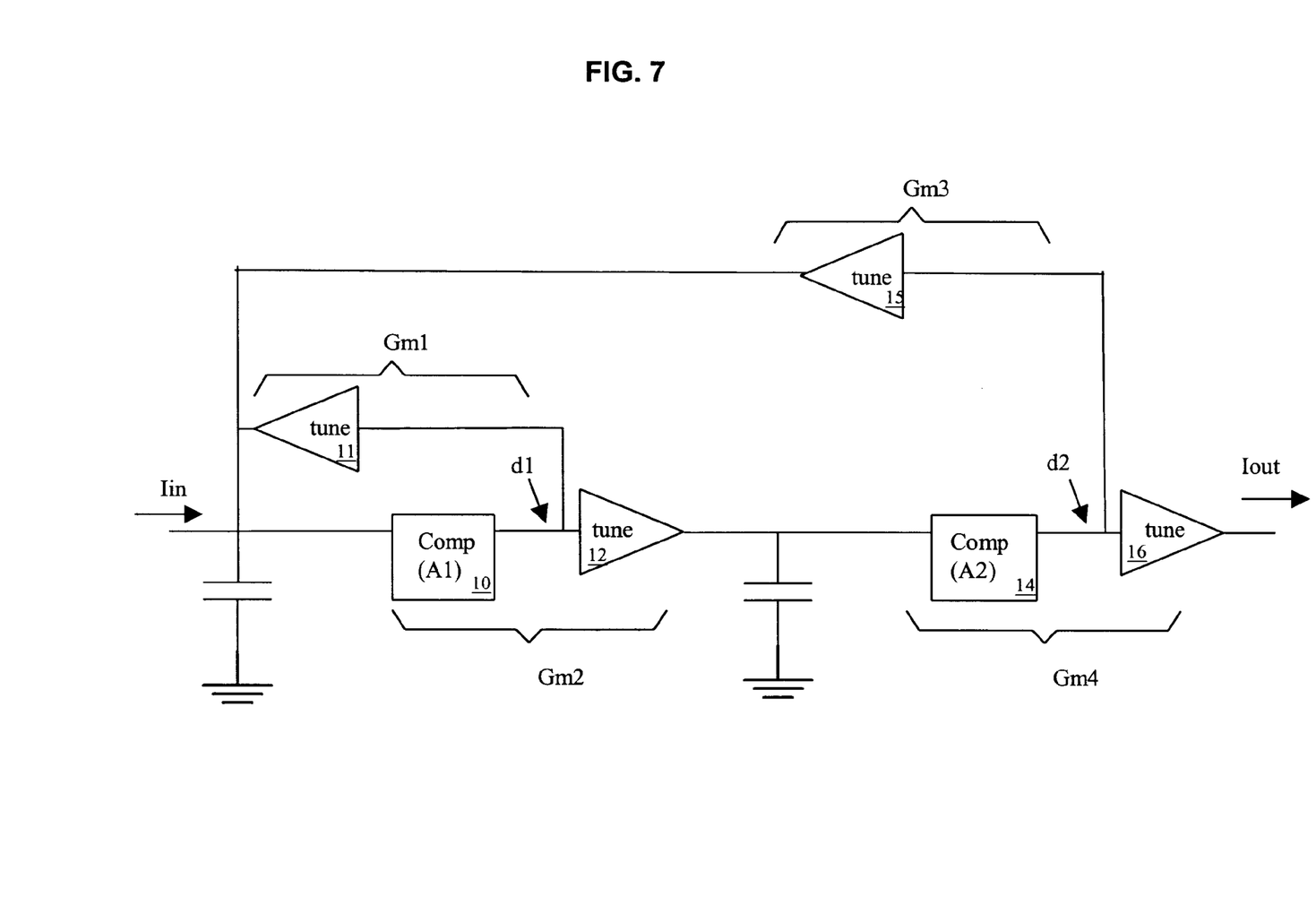
FIG. 7 is a circuit diagram illustrating a two-pole $G_mC$ filter.

FIG. 7 illustrates a system diagram of an embodiment of a $G_mC$ filter with two poles. The two-pole filter includes a GmC filter, including compression stage, 706 and two decompression stages 708 and 710, and a second compression stage 700 with two decompression stages 702 and 704. Using standard control theory for a two pole filter with feedback around two integrators (as shown in FIG. 7), it may be shown that the forward transfer function may be defined as follows:

$$\frac{I_{out}}{I_{in}} = \frac{G_m2 * G_m4}{s^2 + (s * G_m1) + (G_m2 * G_m3)} \qquad \text{Equation 19}$$

As in the analysis of FIG. 3, the transconductance of the differential emitter transistor circuit 706 and first emitter coupled transistor circuit 708 is $G_m1$ and the transconductance of the differential emitter transistor circuit 706 and second emitter coupled transistor circuit 710 is $G_m2$. Likewise, a transconductance of a second differential emitter circuit 700 and a third emitter coupled transistor circuit 702 is $G_m3$ and a transconductance of the second differential emitter circuit 700 and a fourth emitter coupled transistor circuit 704 is $G_m4$.

An analysis of the two pole filter with unwanted noise and interference (shown introduced as d1 and d2) is given below. Perturbations d1 and d2 may be added at each compression stage 706 and 700. The output due to perturbations d1 and d2 may be described as follows:

$$\frac{I_{out}}{I_{in}} = \frac{d2 * \frac{(s^2 * G_m4) + (s * G_m4 * G_m1)}{A2} + d1 * \frac{(s * G_m4 * G_m2)}{A1}}{s^2 + (s * G_m1) + (G_m2 * G_m3)} \quad \text{Equation 20}$$

Both terms in the numerator of this transfer function contain s. As s approaches zero (at low frequencies) these terms approach zero. Thus, unwanted DC offsets and interference appearing in the compression circuitry may be significantly reduced, leaving only the perturbations from the decompression stages.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A $G_mC$ comprising:
    a compression stage configured to receive an input and having an output; and
    at least two decompression stages coupled to the output of the compression stage where a first of the at least two decompression stages providing a feed-back connection to suppress unwanted inband noise and DC offsets to the input of the compression stage and a second of the at least two decompression stages providing a feed-forward connection.

2. The $G_mC$ filter of claim 1, wherein at least two decompression stages are used comprising:
    a first decompression stage providing a current-mode output for feed-back connection to the input of the compression stage; and
    a second decompression stage providing a current-mode output for a feed-forward connection.

3. The $G_mC$ filter of claim 1, wherein the compression stage further comprises transistors, emitter degeneration resistors, constant current sinks and diodes.

4. The $G_mC$ filter of claim 1, wherein the compression stage comprises a differential pair transistor circuit which compresses the input using a first set of coefficients to produce a compressed signal.

5. The $G_mC$ filter of claim 4, wherein the decompression stage comprises a first decompression stage which decompresses the compressed signal using a second set of coefficients to produce a processed signal.

6. The $G_mC$ filter of claim 5, where the processed signal is fedback to the compression stage and compressed using the first set of coefficients to produce the compressed signal.

7. The $G_mC$ filter of claim 1, wherein the compression stage further comprises a first bias current and a first set of compression coefficients.

8. The $G_mC$ filter of claim 7, wherein each decompression stage further comprises a decompression bias current and a set of decompression coefficients.

9. The $G_mC$ filter of claim 8, wherein the first bias current and the decompression bias currents are used to tune gains of the compression and decompression stages.

10. The $G_mC$ filter of claim 1, wherein the compression stage further comprises:
    a differential emitter transistor circuit comprising first and second transistors wherein an input voltage is applied between base electrodes of the first and second transistors and at least one emitter feedback impedance is coupled between emitter electrodes of the first and second transistors; and
    a diode circuit comprising first and second diodes wherein the cathodes of the first and second diodes are coupled and the anode of the first diode is coupled to the collector of the first transistor and the anode of the second diode is coupled to the collector of the second transistor.

11. The $G_mC$ filter of claim 1, wherein the decompression stage further comprises an emitter coupled transistor circuit having two transistors, wherein collectors of the transistors are coupled to a constant current sink.

12. The $G_mC$ filter of claim 11, wherein the emitter coupled transistor circuit is undegenerated.

13. A $G_mC$ filter circuit comprising:
    a capacitor coupled in parallel to a current mode input;
    a differential emitter transistor circuit having first and second transistors wherein voltage across the capacitor is applied between base electrodes of the first and second, transistors, two emitter feedback resistors are coupled between emitter electrodes of the first and second transistors and two constant current sinks are coupled to the emitter electrodes of the first and second transistors;
    two diodes wherein the cathodes of the first and second diodes are coupled and the anode of the first diode is coupled to the collector of the first transistor and the anode of the second diode is coupled to the collector of the second transistor;
    a first emitter coupled transistor circuit having third and fourth transistors, wherein collector current of each of the first and second transistors is supplied to a base electrode of each of the third and fourth transistors, respectively, a constant current mode sink coupled to the emitters of the third and fourth transistors, and wherein collectors of the third and fourth transistors are coupled across the capacitor; and
    a second emitter coupled transistor circuit having fifth and sixth transistors, wherein collector current of each of the first and second transistors is supplied to a base electrode of each of the fifth and sixth transistors, respectively, a constant current mode sink coupled to the emitters of the fifth and sixth transistors, and wherein collectors of the fifth and sixth transistors supply a differential output in current mode.

14. A method for suppressing unwanted signals generated by a compression stage of a $G_mC$ filter, comprising the steps of:
    compressing an input signal using a first set of coefficients to produce a compressed signal;
    decompressing the compressed signal using a second set of coefficients to produce a decompressed signal at least a portion of which is fedback and combined with the input signal to suppress unwanted inband noise and DC offsets; and decompressing the compressed signal using a third set of coefficients to produce an output signal.

15. The method for suppressing unwanted signals as in claim 14, wherein input includes radio frequency.

16. The method for suppressing unwanted signals as in claim 14, wherein the compressed signal is used for both feed forward and feedback.

17. The method for suppressing unwanted signals as in claim 14, wherein compressing includes taking a current-mode signal and converting the signal into a compressed voltage signal.

18. The method for suppressing unwanted signals as in claim 14, wherein decompressing includes taking a compressed voltage signal and converting the signal into a decompressed current-mode signal.

19. The method for suppressing unwanted signals as in claim 14, wherein the third set of coefficients are the same as the second set of coefficients.

20. The method for suppressing unwanted signals as in claim 14 further comprising the steps of:

compressing a second input signal comprising the output signal using a fourth set of coefficients to produce a second compressed signal;

decompressing the second compressed signal using a fifth set of coefficients to produce a second decompressed signal at least a portion of which is fedback and combined with the second input signal; and decompressing the second compressed signal using a sixth set of coefficients to produce a second output signal.

21. A $G_mC$ filter comprising:

means for compressing an input signal using a first set of coefficients to produce a compressed signal;

means for decompressing the compressed signal using a second set of coefficients to produce a decompressed signal at least a portion of which is fedback and combined with the input signal to suppress unwanted inband noise and DC offsets; and means for decompressing the compressed signal using a third set of coefficients to produce an output signal.

22. The $G_mC$ filter of claim 21, wherein input includes radio frequency.

23. The $G_mC$ filter of claim 21, wherein compressing includes taking a current-mode signal and converting the signal into a compressed voltage signal.

24. The $G_mC$ filter of claim 21, wherein decompressing includes taking a compressed voltage signal and converting the signal into a decompressed current-mode signal.

25. The $G_mC$ filter of claim 21, wherein the third set of coefficients are the same as the second set of coefficients.

26. The $G_mC$ filter of claim 21 further comprising:

means for compressing a second input signal comprising the output signal using a fourth set of coefficients to produce a second compressed signal;

means for decompressing the second compressed signal using a fifth set of coefficients to produce a second decompressed signal at least a portion of which is fedback and combined with the second input signal; and means for decompressing the second compressed signal using a sixth set of coefficients to produce a second output signal.

* * * * *